(12) United States Patent
Thor et al.

(10) Patent No.: US 11,108,385 B1
(45) Date of Patent: Aug. 31, 2021

(54) PHASE SHIFTER CIRCUIT OF OPTICAL ENCODER AND OPERATING METHOD THEREOF

(71) Applicant: PixArt Imaging Inc., Hsin-Chu County (TW)

(72) Inventors: Chung-Min Thor, Penang (MY); Kuan-Choong Shim, Penang (MY); Gim-Eng Chew, Penang (MY)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

(21) Appl. No.: 16/907,948

(22) Filed: Jun. 22, 2020

(51) Int. Cl.
| | |
|---|---|
| *H03K 5/13* | (2014.01) |
| *H04J 14/00* | (2006.01) |
| *H03M 1/20* | (2006.01) |
| *H03K 5/24* | (2006.01) |
| *H03K 5/00* | (2006.01) |

(52) U.S. Cl.
CPC ............ *H03K 5/13* (2013.01); *H03K 5/24* (2013.01); *H03M 1/206* (2013.01); *H04J 14/005* (2013.01); *H03K 2005/00052* (2013.01); *H03K 2005/00286* (2013.01)

(58) Field of Classification Search
CPC .......... H03M 1/206; H03K 5/13; H03K 5/24; H03K 2005/00286; H03K 2005/00052; H04J 14/005
See application file for complete search history.

(56) References Cited

U.S. PATENT DOCUMENTS

| | | | |
|---|---|---|---|
| 2008/0049008 A1* | 2/2008 | Chen | G09G 3/3611 345/211 |
| 2016/0218429 A1* | 7/2016 | Klemes | C02F 1/4695 |
| 2017/0019067 A1* | 1/2017 | Chakraborty | H03K 5/01 |
| 2017/0295632 A1* | 10/2017 | Sun | H04B 7/2643 |
| 2020/0166383 A1* | 5/2020 | Thor | H03K 5/24 |

* cited by examiner

*Primary Examiner* — Lam T Mai
(74) *Attorney, Agent, or Firm* — Hauptman Ham, LLP (57) ABSTRACT

There is provided a phase shifter circuit of an optical encoder that receives four signals generated from photodiodes. The phase shifter circuit includes four resistor strings each coupled to two of the four signals having a 90-degrees phase pitch. By taping out different numbers of signals at different tape-out nodes of each of the four resistor strings, the phase shifter circuit is adapted to output signals for different interpolation factors without changing the mask set.

20 Claims, 7 Drawing Sheets

PHASE SHIFTER CIRCUIT OF OPTICAL ENCODER AND OPERATING METHOD THEREOF

BACKGROUND

1. Field of the Disclosure

This disclosure generally relates to an optical encoder and, more particularly, to a phase shifter circuit of an optical encoder that has changeable output tap positions to be adapted to different interpolation factors and to fine tune the phase of output signals thereof.

2. Description of the Related Art

Figure 1:
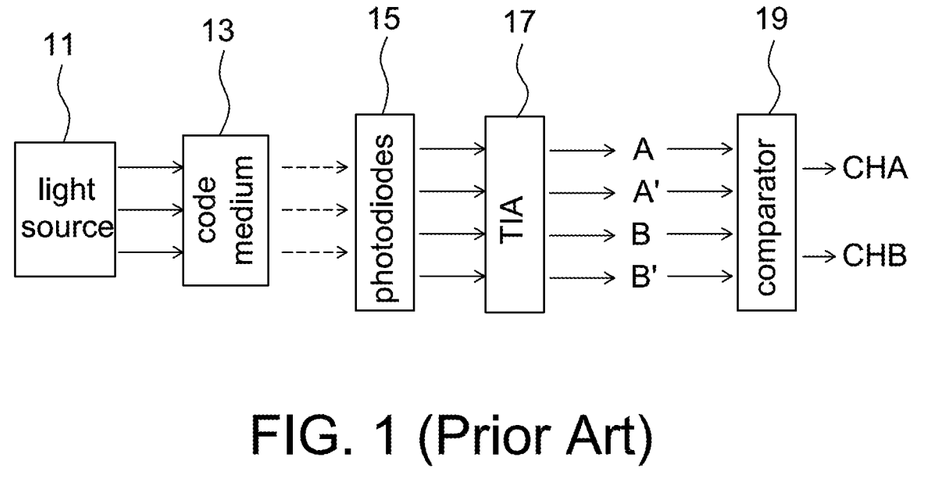
FIG. 1 is a block diagram of a conventional optical encoder.

Referring to FIG. 1, it is a block diagram of a conventional optical encoder that includes a light source 11, a code medium 13, photodiodes 15, a trans-impedance amplifier (TIA) 17 and a comparator 19. The photodiodes 15 detect light emitted from the light source 11 and modulated by the code medium 13 to output four signals A, A', B and B' sequentially having a 90 degrees phase shift via the TIA 17. The comparator 19 compares the four signals A, A', B and B' to output two output signals CHA and CHB.

Figure 2:
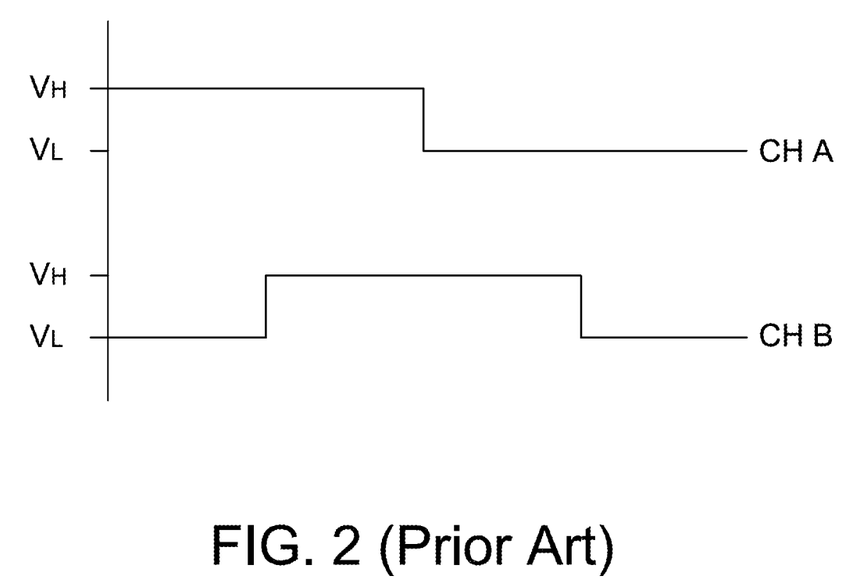
FIG. 2 is a timing diagram of output signals of the optical encoder in FIG. 1.

FIG. 2 is a timing diagram of the output signals CHA and CHB. It is seen from FIG. 2 that voltage levels of the output signals CHA and CHB have a combination of four states within one period of the code medium 13. Accordingly, four positions of the code medium 13 can be indicated.

Figure 3:
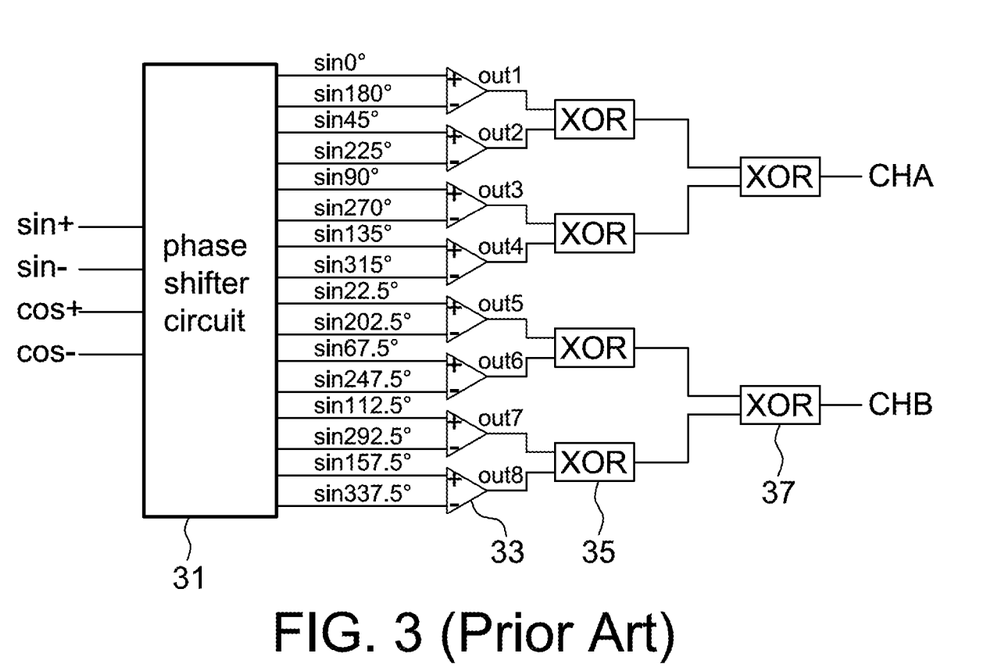
FIG. 3 is a schematic diagram of a conventional interpolation circuit of an optical encoder.
Figure 4:
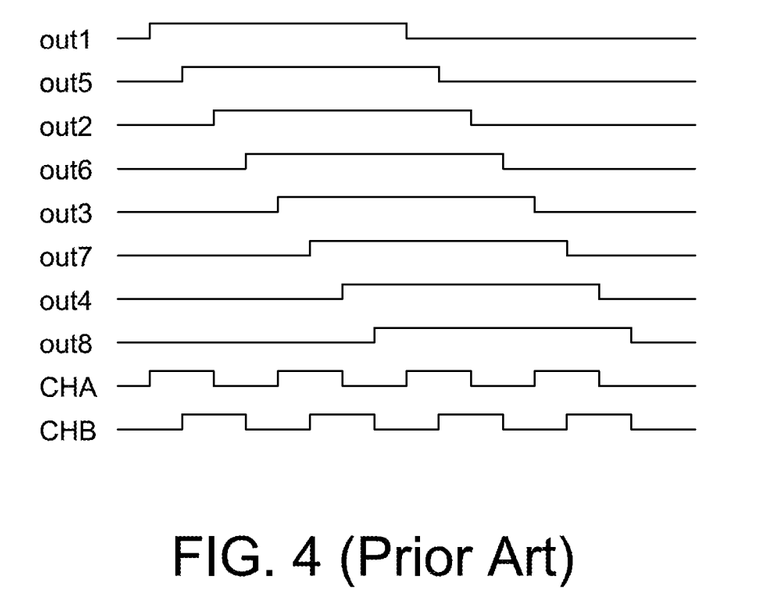
FIG. 4 is a timing diagram of output signals of the interpolation circuit in FIG. 3.

However, to improve positioning resolution, a combination of four states is not enough. FIG. 3 shows a conventional 4-times (or 4-fold) interpolation circuit that includes a phase shifter circuit 31, multiple comparators 33, multiple first XOR gates 35 and multiple second XOR gates 37. FIG. 4 is a timing diagram of comparison signals out1 to out8 and output signals CHA and CHB in FIG. 3. It is seen from FIG. 4 that the output signals CHA and CHB can indicate 16 states within one period of the code medium 13, and thus 4-times positioning resolution is achieved.

Accordingly, it is necessary to provide a phase shifter circuit for an optical encoder that can output different phase-shifted signals corresponding to different interpolation factors of the optical encoder.

SUMMARY

The present disclosure provides a phase shifter circuit of an optical encoder that output different phase shifted signals via different tape positions of four resistor strings to be adapted to different interpolation factors.

The present disclosure provides a phase shifter circuit of an optical encoder. The phase shifter circuit is configured to receive a first signal, a second signal, a third signal and a fourth signal sequentially having a 90-degrees phase shift. The phase shifter circuit includes a first resistor string, a second resistor string, a third resistor string, a fourth resistor string and 4×(M−1) tape-out nodes. The first resistor string has M identical first resistors cascaded together, and two ends of the first resistor string are configured to receive the first signal and the second signal, respectively. The second resistor string has M identical second resistors cascaded together, and two ends of the second resistor string are configured to receive the second signal and the third signal, respectively. The third resistor string has M identical third resistors cascaded together, and two ends of the third resistor string are configured to receive the third signal and the fourth signal, respectively. The fourth resistor string has M identical fourth resistors cascaded together, and two ends of the fourth resistor string are configured to receive the fourth signal and the first signal, respectively. The tape-out nodes are respectively located between every two adjacent resistors of the M first resistors, the M second resistors, the M third resistors and the M fourth resistors. A number of tape-out signals from each of the first, second, third and fourth resistor strings is equal to an interpolation factor N of the optical encoder subtracted by 1.

The present disclosure further provides an optical encoder including multiple photodiodes, a phase shifter circuit and a comparison logic circuit. The photodiodes are configured to receive light from a code medium to output a first signal, a second signal, a third signal and a fourth signal sequentially having a 90-degrees phase shift. The phase shifter circuit includes 4 resistor strings each having M identical resistors cascaded together and respectively receiving two of the first, second, third and fourth signals having the 90-degrees phase shift, wherein a number of tape-out signals from each of the 4 resistor strings is equal to an interpolation factor N of the optical encoder subtracted by 1. The comparison logic circuit is coupled to the phase shifter circuit, and configured to use the first, second, third and fourth signals as well as the 4×(N−1) tape-out signals from the 4 resistor strings to generate two N-fold interpolation signals.

The present disclosure further provides an operating method of a phase shifter circuit of an optical encoder. The phase shifter circuit includes four resistor strings each having M identical resistors cascaded together and (M−1) tape-out nodes respectively located between every two adjacent resistors of the M identical resistors. Each of the four resistor strings receives two signals among four signals having a 90-degrees phase pitch. The operating method includes the step of: taping out a first number of tape-out signals at first tape-out nodes from each of the 4 resistor strings when the optical encoder is set as a first interpolation factor N1; and taping out a second number of tape-out signals at second tape-out nodes from each of the 4 resistor strings when the optical encoder is set as a second interpolation factor N2 different from the first interpolation factor N1, wherein the first tape-out nodes are determined according to values of 360°/4N1 and multiples of 360°/4N1, and the second tape-out nodes are determined according to values of 360°/4N2 and multiples of 360°/4N2.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The phase shifter circuit of an optical encoder of the present disclosure is adaptable to any interpolation factor only by changing tape-out positions of output signals at resistor strings. Furthermore, phases of the output signals may be deviated due to the system misalignment to have the phase deviation more or less than a tolerable range. This phase deviation can also be calibrated by changing one step of the tape-out positions of the output signals at the corresponding resistor string.

Figure 5:
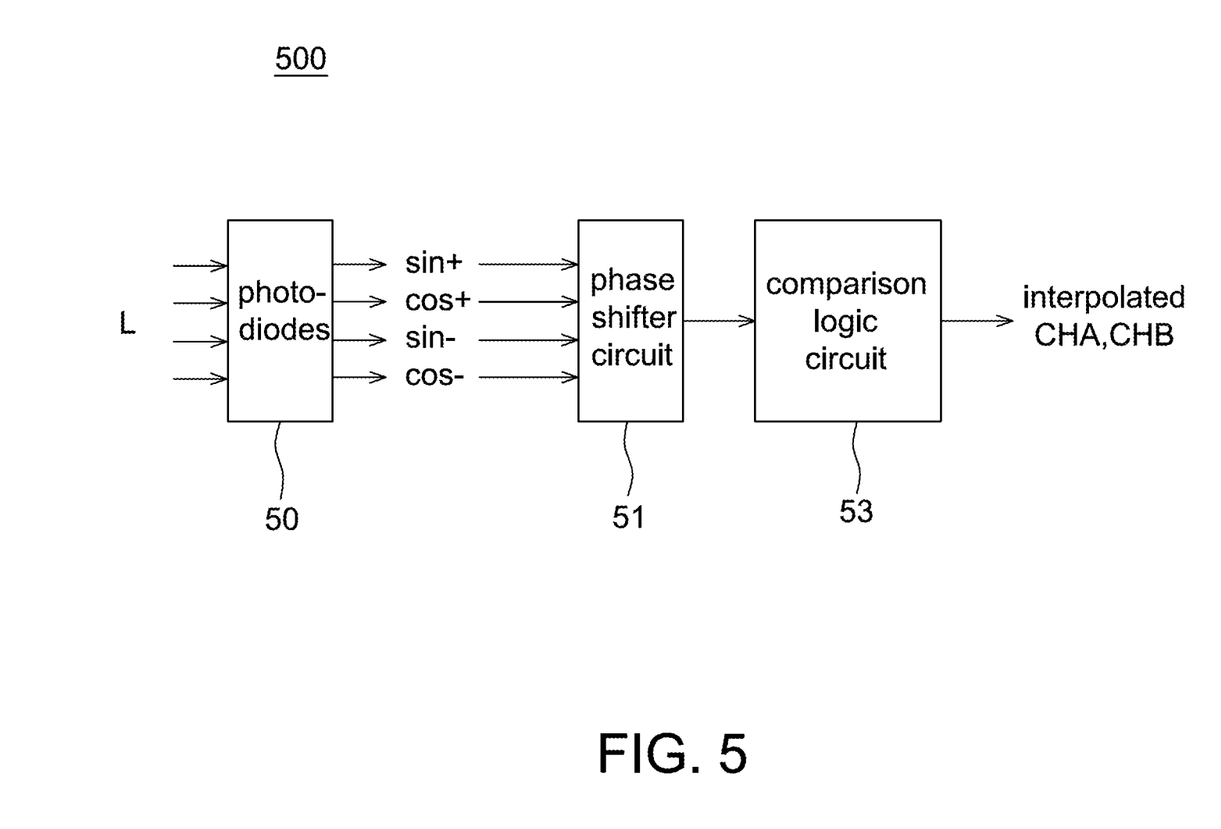
FIG. 5 is a block diagram of a phase shifter circuit of an optical encoder according to one embodiment of the present disclosure.

Referring to FIG. 5, it is a block diagram of an optical encoder 500 according to one embodiment of the present disclosure. The optical encoder 500 includes at least a code medium (not shown), photodiodes 50, a TIA (not shown), a phase shifter circuit 51 and a comparison logic circuit 53.

The comparison logic circuit 53 receives multiple phase shifted signals (e.g., referring FIGS. 6 and 7) to generate two N-fold interpolation signals, wherein N is an interpolation factor of the optical encoder 500 and a value of N is determined according to different applications. One example of the comparison logic circuit 53 may be referred to U.S. patent application Ser. No. 16/427,872, filed on May 31, 2018, assigned to the same assignee of the present disclosure, and the full disclosure of which is incorporated herein by reference. Another example of the comparison logic circuit 53 may be referred to FIG. 4 in which two 4-fold interpolation signals are generated.

As shown in FIG. 5, the photodiodes 50 receive light L from the code medium (e.g., a code wheel or a code strip) to output a first signal sin+, a second signal cos+, a third signal sin− and a fourth signal cos− sequentially having a 90-degrees phase shift. The phase shifter circuit 51 receives the first signal sin+, the second signal cos+, the third signal sin− and the fourth signal cos− having the 90-degrees phase pitch from the photodiodes 50 via a trans-impedance amplifier (TIA). In one non-limiting aspect, the first signal and third signal are sine wave signals, the second signal and the fourth signal are cosine wave signals, the third signal sin− and the first signal sin+ are 180° output of phase, and the fourth signal cos− and the second signal cos+ are 180° output of phase. However, the present disclosure is not limited thereto.

In another non-limiting aspect, the optical encoder 500 further includes a signal processing circuit for processing output signals of multiple photodiodes 50 to generate ramp signals as the first signal, the second signal, the third signal and the fourth signal to be sent to the phase shifter circuit 51. Said ramp signals also have the above mentioned phase shifts.

The method of generating the first signal, the second signal, the third signal and the fourth signal is known to the art and not a main objective of the present disclosure, and thus details thereof are not described herein. The present disclosure is to use these four signals to generate multiple phase shifted signals have a phase pitch smaller than 90 degrees.

The phase shifter circuit 51 receives the first signal sin+, the second signal cos+, the third signal sin− and the fourth signal cos− sequentially having the 90-degrees phase shift to accordingly generate and output a number of 4N phase shifted signals, wherein N is an interpolation factor. The 4N phase shifted signals have a 360°/4N phase pitch, and amplitudes thereof change with time.

Figure 6:
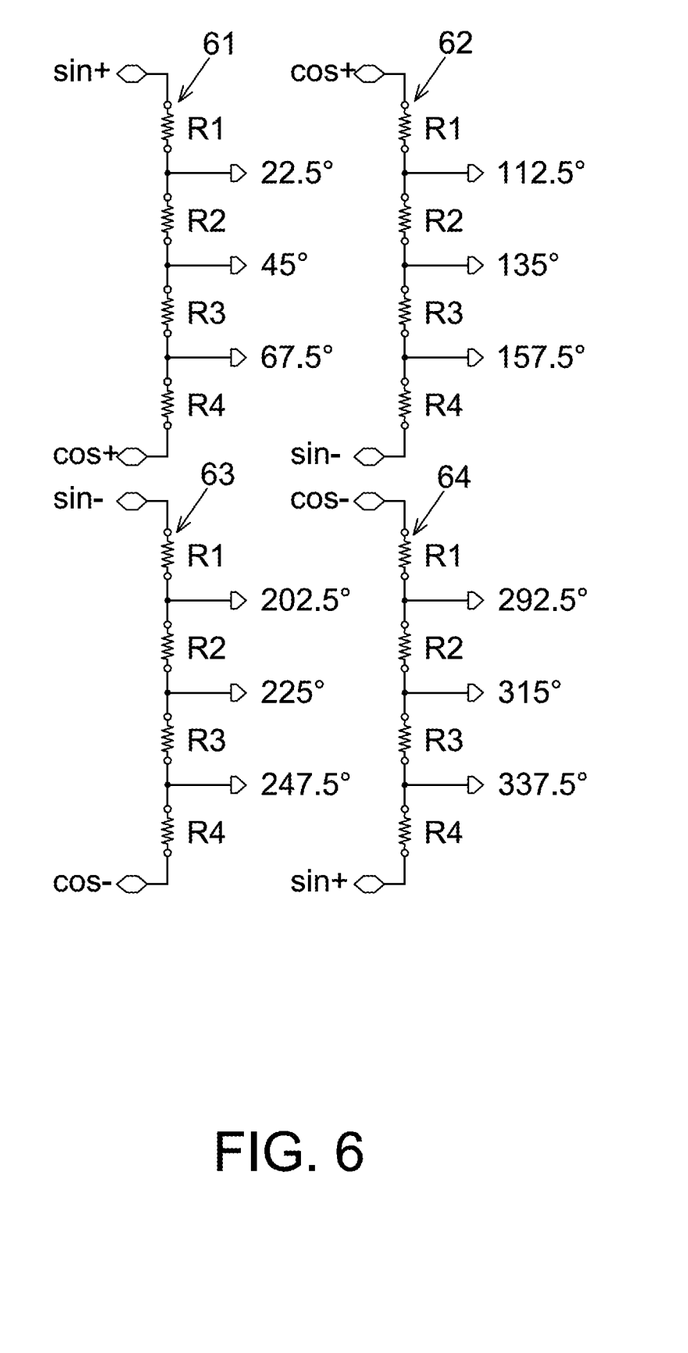
FIG. 6 is a circuit diagram of a phase shifter circuit of an optical encoder according to a first embodiment of the present disclosure.

Referring to FIG. 6, it is a circuit diagram included in a phase shifter circuit 51 of an optical encoder 500 according to a first embodiment of the present disclosure. The phase shifter circuit 51 includes a first resistor string 61, a second resistor string 62, a third resistor string 63 and a fourth resistor string 64. FIG. 6 is adapted to an interpolation factor N=4.

The first resistor string 61 has four resistors R1-R4 cascaded together, and two ends of the first resistor string 61 receive the first signal sin+ (e.g., from an upper end in FIG. 6) and the second signal cos+ (e.g., from a lower end in FIG. 6), respectively.

The second resistor string 62 has the four resistors R1-R4 cascaded together, and two ends of the second resistor string 62 receive the second signal cos+ (e.g., from an upper end in FIG. 6) and the third signal sin− (e.g., from a lower end in FIG. 6), respectively.

The third resistor string 63 has the four resistors R1-R4 cascaded together, and two ends of the third resistor string 63 receive the third signal sin− (e.g., from an upper end in FIG. 6) and the fourth signal cos− (e.g., from a lower end in FIG. 6), respectively.

The fourth resistor string 64 has the four resistors R1-R4 cascaded together, and two ends of the fourth resistor string 64 receive the fourth signal cos− (e.g., from an upper end in FIG. 6) and the first signal sin+ (e.g., from a lower end in FIG. 6), respectively.

Referring to Table 1 below, in order to output signals having a 22.5° phase shift, a 45° phase shift and a 67.5° phase shift from the first signal sin+ (e.g., assumed having 0° phase), from the second signal cos+ (e.g., assumed having 90° phase), from the third signal sin− (e.g., assumed having 180° phase) and from the fourth signal cos− (e.g., assumed having 270° phase), respectively, resistors R1-R4 are calculated according to $\theta=22.5°$, $\theta=45°$ and $\theta=67.5°$ as Table 1, wherein Z1 is a positive value which is determined according to usable resistance in the phase shifter circuit 51. It is seen from Table 1 that a R ratio sum of R1/(R1+R2+R3+R4)=0.2929; a R ratio sum of (R1+R2)/(R1+R2+R3+R4)=0.500; a R ratio sum of (R1+R2+R3)/(R1+R2+R3+R4)=0.7071. These R ratio sums are used as tape-out nodes in the third embodiment below.

TABLE 1

| θ (phase shift) | $X = 1/(1 - \tan(-\theta))$ | 1 − X (R ratio sum) | Resistor Size |
| --- | --- | --- | --- |
| 0° | 1.000 | 0 | 0 |
| 22.5° | 0.7071 | 0.2929 | R1 = 0.2929 × Z1 |
| 45° | 0.500 | 0.500 | R2 = (0.5 − 0.2929) × Z1 |
| 67.5° | 0.2929 | 0.7071 | R3 = (0.7071 − 0.5) × Z1 = R2 |
| 90° | 0.000 | 1.000 | R4 = (1 − 0.7071) × Z1 = R1 |

In this way, the phase shifter circuit 51 outputs the first signal sin+, the second signal cos+, the third signal sin− and the fourth signal cos− as well as twelve phase shifted signals having a phase shift 22.5°, 45°, 67.5°, 112.5°, 135°, 157.5°, 202.5°, 225°, 247.5°, 292.5°, 315° and 337.5° from the first signal sin+.

Figure 7:
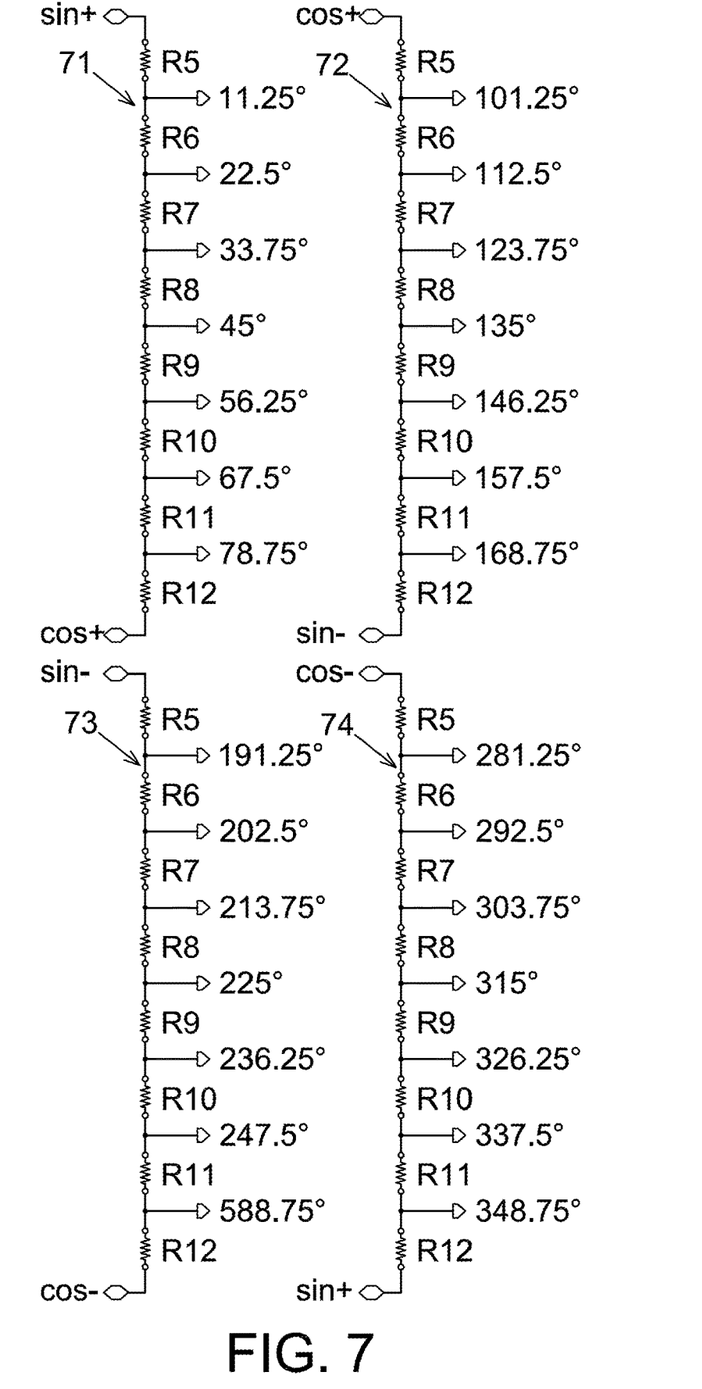
FIG. 7 is a circuit diagram of a phase shifter circuit of an optical encoder according to a second embodiment of the present disclosure.

Referring to FIG. 7, it is a circuit diagram included in a phase shifter circuit 51 of an optical encoder 500 according to a second embodiment of the present disclosure. The phase shifter circuit 51 includes a first resistor string 71, a second resistor string 72, a third resistor string 73 and a fourth resistor string 74. FIG. 7 is adapted to an interpolation factor N=8.

The first resistor string 71 has eight resistors R5-R12 cascaded together, and two ends of the first resistor string 71 receive the first signal sin+ (e.g., from an upper end in FIG. 7) and the second signal cos+ (e.g., from a lower end in FIG. 7), respectively.

The second resistor string 72 has the eight resistors R5-R12 cascaded together, and two ends of the second resistor string 72 receive the second signal cos+ (e.g., from an upper end in FIG. 7) and the third signal sin− (e.g., from a lower end in FIG. 7), respectively.

The third resistor string 73 has the eight resistors R5-R12 cascaded together, and two ends of the third resistor string 73 receive the third signal sin− (e.g., from an upper end in FIG. 7) and the fourth signal cos− (e.g., from a lower end in FIG. 7), respectively.

The fourth resistor string 74 has the eight resistors R5-R12 cascaded together, and two ends of the fourth resistor string 74 receive the fourth signal cos− (e.g., from an upper end in FIG. 7) and the first signal sin+ (e.g., from a lower end in FIG. 7), respectively.

Referring to Table 2 below, in order to output signals having a 11.25° phase shift, a 22.5° phase shift, a 33.75° phase shift, a 45° phase shift, a 56.25° phase shift, a 67.5° phase shift and a 78.75° phase shift from the first signal sin+ (e.g., assumed having 0° phase), from the second signal cos+ (e.g., assumed having 90° phase shift), from the third signal sin− (e.g., assumed having 180° phase) and from the fourth signal cos− (e.g., assumed having 270° phase), respectively, resistors R5-R12 are calculated according to θ=11.25°, θ=22.5°, θ=33.75°, θ=45°, θ=56.25°, θ=67.5° and θ=78.75° as Table 2, wherein Z2 is a positive value which is determined according to usable resistance in the phase shifter circuit 51. The R ratio sums are also shown in Table. 2. These R ratio sums are used as tape-out nodes in the third embodiment below.

TABLE 2

| θ (phase shift) | X = 1/(1 − tan(−θ)) | 1 − X (R ratio sum) | Resistor Size |
|---|---|---|---|
| 0° | 1.0000 | 0.0000 | 0 |
| 11.25° | 0.8341 | 0.1659 | R5 = 0.166 × Z2 |
| 22.5° | 0.7071 | 0.2929 | R6 = 0.127 × Z2 |
| 33.75° | 0.5995 | 0.4005 | R7 = 0.108 × Z2 |
| 45° | 0.5000 | 0.5000 | R8 = 0.99 × Z2 |
| 56.25° | 0.4005 | 0.5995 | R9 = 0.99 × Z2 = R8 |
| 67.5° | 0.2929 | 0.7071 | R10 = 0.108 × Z2 = R7 |
| 78.75° | 0.1659 | 0.8341 | R11 = 0.127 × Z2 = R6 |
| 90° | 0.0000 | 1.0000 | R12 = 0.166 × Z2 = R5 |

In this way, the phase shifter circuit 51 outputs the first signal sin+, the second signal cos+, the third signal sin− and the fourth signal cos− as well as twenty eight phase shifted signals having a phase shift 11.25°, 22.5°, 33.75°, 45°, 56.25°, 67.5° and 78.75° from each of the first signal sin+, the second signal cos+, the third signal sin− and the fourth signal cos− as shown in FIG. 7.

It is seen from FIGS. 6-7 that if the interpolation factor N is changed, a different resistor mixer, e.g., including the first, second, third and fourth resistor strings, have to be used. One phase shifter circuit 51 is not suitable to be used if a different interpolation factor N is required.

Accordingly, the present disclosure further provides a phase shifter circuit 51 suitable to any desired interpolation factor N.

Figure 8:
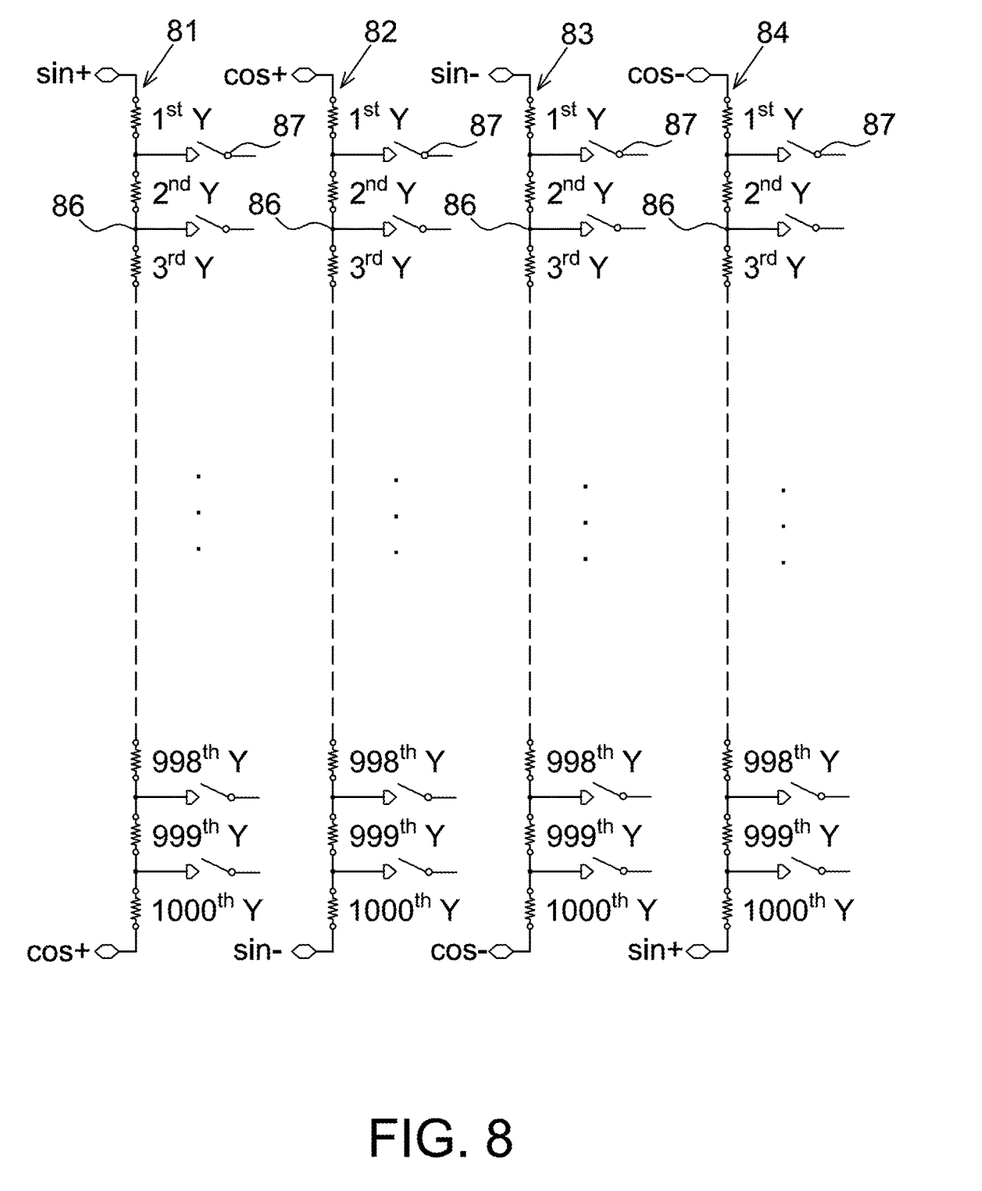
FIG. 8 is a circuit diagram of a phase shifter circuit of an optical encoder according to a third embodiment of the present disclosure.

Referring to FIG. 8, it is a circuit diagram of a phase shifter circuit 51 of an optical encoder 500 according to a third embodiment of the present disclosure. The phase shifter circuit 51 of this embodiment also includes four resistor strings 81-84 each having M (e.g., M=1000 being taken as an example herein, but a value of M not limited to 1000) identical resistors cascaded together and respectively receiving two of the first signal, the second signal, the third signal and the fourth signal having the 90-degrees phase pitch.

More specifically, the first resistor string 81 has M identical first resistors (shown as $1^{st}$ Y to $1000^{th}$ Y in FIG. 8) cascaded together, and two ends of the first resistor string 81 receive the first signal sin+ (e.g., from an upper end in FIG. 8) and the second signal cos+ (e.g., from a lower end in FIG. 8), respectively.

The second resistor string 82 has M identical second resistors (also shown as $1^{st}$ Y to $1000^{th}$ Y in FIG. 8) cascaded together, and two ends of the second resistor string 82 receive the second signal cos+ (e.g., from an upper end in FIG. 8) and the third signal sin− (e.g., from a lower end in FIG. 8), respectively.

The third resistor string 83 has M identical third resistors (also shown as $1^{st}$ Y to $1000^{th}$ Y in FIG. 8) cascaded together, and two ends of the third resistor string 83 receive the third signal sin− (e.g., from an upper end in FIG. 8) and the fourth signal cos− (e.g., from a lower end in FIG. 8), respectively.

The fourth resistor string 84 has M identical fourth resistors (also shown as $1^{st}$ Y to $1000^{th}$ Y in FIG. 8) cascaded together, and two ends of the fourth resistor string 84 receive the fourth signal cos− (e.g., from an upper end in FIG. 8) and the first signal sin+ (e.g., from a lower end in FIG. 8), respectively.

In the present disclosure, the first, second, third and fourth resistors are all identical, e.g., shown as Y in FIG. 8, wherein Y is a resistor having any suitable resistance.

The phase shifter circuit 51 further includes a number of 4×(M−1) tape-out nodes 86 respectively located between every two adjacent resistors of the M first, second, third and fourth resistors Y. That is, the first resistor string 81 has (M−1) tape-out nodes 86 respectively located between every two adjacent first resistors of the M first resistors; the second resistor string 82 has (M−1) tape-out nodes 86 respectively located between every two adjacent second resistors of the M second resistors; the third resistor string 83 has (M−1) tape-out nodes 86 respectively located between every two adjacent third resistors of the M third resistors; and the fourth resistor string 84 has (M−1) tape-out nodes 86 respectively located between every two adjacent fourth resistors of the M fourth resistors.

The tape-out nodes 86 are used to output tape-out signals, which are used to be compared to generate two N-fold interpolation signals, having different phase shift from the first signal sin+, the second signal cos+, the third signal sin− and the fourth signal cos−. In one non-limiting aspect, the phase shifter circuit 51 further includes 4×(M−1) switching devices 87 corresponding to the 4×(M−1) tape-out nodes 86 and used to be coupled to the 4×(M−1) tape-out nodes 86 to output the tape-out signals, described using an example below.

In this embodiment, a number of tape-out signals from each of the first resistor string 81, the second resistor string 82, the third resistor string 83 and the fourth resistor string 84 is equal to an interpolation factor N of the optical encoder 500 subtracted by 1, i.e. outputting (N−1) tape-out signals.

The comparison logic circuit 53 is coupled to the phase shifter circuit 51, and uses the first signal sin+, the second signal cos+, the third signal sin−, the fourth signal cos− and the 4×(N−1) tape-out signals from the 4 resistor strings 81-84 to generate two N-fold interpolation signals. As mentioned above, examples of the interpolation circuit may be referred to U.S. patent application Ser. No. 16/427,872 or FIG. 3, and thus details thereof are not described herein.

Referring to FIG. 6 and Table 1 together, when N=4, 3 tape-out signals are outputted at a 293th node, a 500th node and a 707th node of the tape-out nodes 86 of each of the first resistor string 81, the second resistor string 82, the third resistor string 83 and the fourth resistor string 84 since all resistors have identical resistance Y.

More specifically, the 293th node of the first resistor string 81, the second resistor string 82, the third resistor string 83 and the fourth resistor string 84 outputs a tape-out signal having a 22.5° phase shift respectively from the first signal sin+, the second signal cos+, the third signal sin− and the fourth signal cos−. The 500th node of the first resistor string 81, the second resistor string 82, the third resistor string 83 and the fourth resistor string 84 outputs a tape-out signal having a 45° phase shift respectively from the first signal sin+, the second signal cos+, the third signal sin− and the fourth signal cos−. The 707th node of the first resistor string 81, the second resistor string 82, the third resistor string 83 and the fourth resistor string 84 outputs a tape-out signal having a 67.5° phase shift respectively from the first signal sin+, the second signal cos+, the third signal sin− and the fourth signal cos−. The number one tape-out node in the first resistor string 81, the second resistor string 82, the third resistor string 83 and the fourth resistor string 84 from top in FIG. 8 herein is the 1st tape-out node.

Referring to FIG. 7 and Table 2 together, when N=8, 7 tape-out signals are outputted at a 166th node, a 293th node, a 401th node, a 500th node, a 600th node, a 707th node and a 834th node of the tape-out nodes 86 of each of the first resistor string 81, the second resistor string 82, the third resistor string 83 and the fourth resistor string 84 since all resistors have identical resistance Y.

In addition to the 293th node, a 500th node and a 707th node mentioned above, the 166th node of the first resistor string 81, the second resistor string 82, the third resistor string 83 and the fourth resistor string 84 outputs a tape-out signal having a 11.25° phase shift respectively from the first signal sin+, the second signal cos+, the third signal sin− and the fourth signal cos−. The 401th node of the first resistor string 81, the second resistor string 82, the third resistor string 83 and the fourth resistor string 84 outputs a tape-out signal having a 33.75° phase shift respectively from the first signal sin+, the second signal cos+, the third signal sin− and the fourth signal cos−. The 600th node of the first resistor string 81, the second resistor string 82, the third resistor string 83 and the fourth resistor string 84 outputs a tape-out signal having a 56.25° phase shift respectively from the first signal sin+, the second signal cos+, the third signal sin− and the fourth signal cos−. The 834th node of the first resistor string 81, the second resistor string 82, the third resistor string 83 and the fourth resistor string 84 outputs a tape-out signal having a 78.75° phase shift respectively from the first signal sin+, the second signal cos+, the third signal sin− and the fourth signal cos−.

Furthermore, in an embodiment that M=802 and 4-fold interpolation, 3 tape-out signals are outputted at a 235th node, a 401th node and a 567th node of the tape-out nodes 86 of each of the first resistor string 81, the second resistor string 82, the third resistor string 83 and the fourth resistor string 84.

In an embodiment that M=802 and 8-fold interpolation, 7 tape-out signals are outputted at a 133th node, a 235th node, a 321th node, a 401th node, a 481th node, a 567th node and a 669th node of the tape-out nodes 86 of each of the first resistor string 81, the second resistor string 82, the third resistor string 83 and the fourth resistor string 84.

Furthermore, in an embodiment that M=502 and 4-fold interpolation, 3 tape-out signals are outputted at a 147th node, a 251th node and a 355th node of the tape-out nodes 86 of each of the first resistor string 81, the second resistor string 82, the third resistor string 83 and the fourth resistor string 84.

In an embodiment that M=502 and 8-fold interpolation, 7 tape-out signals are outputted at a 83th node, a 147th node, a 201th node, a 251th node, a 301th node, a 355th node and a 419th node of the tape-out nodes 86 of each of the first resistor string 81, the second resistor string 82, the third resistor string 83 and the fourth resistor string 84.

In an alternative embodiment, if it is desired to generate 5-fold or 10-fold interpolation signals, each of the first, second, third and fourth resistor strings includes 5 or 10 cascaded resistors. Similar to Table 2, it is able to obtain parameters as Table 3.

| θ (phase shift) | X = 1/(1 − tan(−θ)) | 1 − X (R ratio sum) | Resistor Size |
|---|---|---|---|
| 0° | 1.000 | 0.000 | 0 |
| 9° | 0.863 | 0.137 | R1 = 0.137 × Z3 |
| 18° | 0.755 | 0.245 | R2 = 0.109 × Z3 |
| 27° | 0.662 | 0.338 | R3 = 0.092 × Z3 |
| 36° | 0.579 | 0.421 | R4 = 0.083 × Z3 |
| 45° | 0.500 | 0.500 | R5 = 0.079 × Z3 |
| 54° | 0.421 | 0.579 | R6 = R5 |
| 63° | 0.338 | 0.662 | R7 = R4 |
| 72° | 0.245 | 0.755 | R8 = R3 |
| 81° | 0.137 | 0.863 | R9 = R2 |
| 90° | 0.000 | 1.000 | R10 = R1 |

In an embodiment that M=1000 and 5-fold interpolation using FIG. 8, 4 tape-out signals are outputted at a 246th node, a 421th node, a 579th node and a 754th node of the tape-out nodes 86 of each of the first resistor string 81, the second resistor string 82, the third resistor string 83 and the fourth resistor string 84.

In an embodiment that M=1000 and 10-fold interpolation using FIG. 8, 9 tape-out signals are outputted at a 137th node, a 246th node, a 338th node, a 421th node, a 500th node, a 579th node, a 662th node, a 754th node and a 863th node of the tape-out nodes 86 of each of the first resistor string 81, the second resistor string 82, the third resistor string 83 and the fourth resistor string 84.

In an embodiment that M=802 and 5-fold interpolation using FIG. 8, 4 tape-out signals are outputted at a 197th node, a 338th node, a 464th node and a 605th node of the tape-out nodes 86 of each of the first resistor string 81, the second resistor string 82, the third resistor string 83 and the fourth resistor string 84.

In an embodiment that M=802 and 10-fold interpolation using FIG. 8, 9 tape-out signals are outputted at a 110th node, a 197th node, a 271th node, a 338th node, a 401th node, a 464th node, a 531th node, a 605th node and a 692th node of the tape-out nodes 86 of each of the first resistor string 81, the second resistor string 82, the third resistor string 83 and the fourth resistor string 84.

In an embodiment that M=502 and 5-fold interpolation using FIG. 8, 4 tape-out signals are outputted at a 123th node, a 211th node, a 291th node and a 379th node of the tape-out nodes 86 of each of the first resistor string 81, the second resistor string 82, the third resistor string 83 and the fourth resistor string 84.

In an embodiment that M=502 and 10-fold interpolation using FIG. 8, 9 tape-out signals are outputted at a 69th node, a 123th node, a 169th node, a 211th node, a 251th node, a 291th node, a 333th node, a 379th node and a 433th node of the tape-out nodes 86 of each of the first resistor string 81, the second resistor string 82, the third resistor string 83 and the fourth resistor string 84.

In the present disclosure, the switching devices 87 are controlled by an Application Specific Integrated Circuit (ASIC) of the optical encoder 500 to connect or dis-connect the corresponding tape-out nodes for outputting the corresponding tape-out signals. In another aspect, the switching devices 87 are replaced by four multiplexers each coupled to one of the first resistor string 81, the second resistor string 82, the third resistor string 83 and the fourth resistor string 84.

In one aspect, a selected tape-out node of one tape-out signal is changed to an adjacent tape-out node when a phase of the one tape-out signal outputted from the selected tape-out node has a deviation larger than or smaller than a deviation threshold due to calibration or manufacturing misalignment.

For example, as mentioned above, the 293th node of the first resistor string 81 is set to output a tape-out signal having 22.5° phase shift from the first signal sin+. However, due to the misalignment, the tape-out signal outputted from the 293th node of the first resistor string 81 may be larger than or smaller than 22.5° by a phase deviation. If the phase deviation is larger than or smaller than a predetermined deviation threshold (e.g., pre-set according to the resolution of the optical encoder), the ASIC turns on the 292th or 294th switching device 87 and turns off the 293th switch device 87 to calibrate the phase deviation to be within the predetermined deviation threshold.

Figure 9:
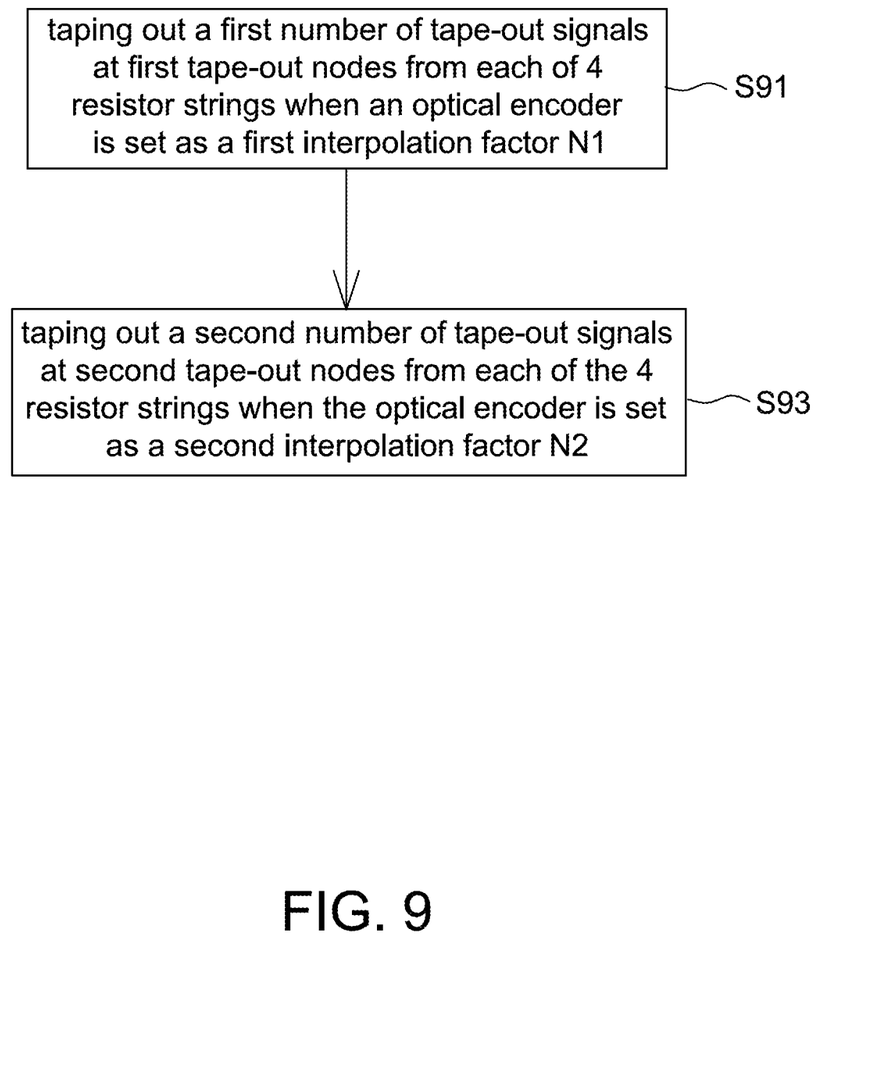
FIG. 9 is a flow chart of an operating method of a phase shifter circuit of an optical encoder according to one embodiment of the present disclosure.

Referring to FIG. 9, it is an operating method of a phase shifter circuit 51 of an optical encoder 500 according to one embodiment of the present disclosure. The method includes the steps of: taping out a first number of tape-out signals at first tape-out nodes from each of 4 resistor strings 81-84 when the optical encoder is set as a first interpolation factor N1 (Step S91); and taping out a second number of tape-out signals at second tape-out nodes from each of the 4 resistor strings 81-84 when the optical encoder is set as a second interpolation factor N2 different from the first interpolation factor N1 (Step S93). In this embodiment, the first tape-out nodes are determined according to values of 360°/4N1 and multiples of 360°/4N1 as shown in Table 1, and the second tape-out nodes are determined according to values of 360°/4N2 and multiples of 360°/4N2 as shown in Table 2.

Step S91: For example, when N1=4, three tape-out signals at first tape-out nodes, e.g., a 293th node, a 500th node and a 707th node among 1000 tape-out nodes, are outputted from each of the 4 resistor strings 81-84 by conducting the 293th, 500th and 707th switching devices 87. The number one switching device in the first resistor string 81, the second resistor string 82, the third resistor string 83 and the fourth resistor string 84 from top in FIG. 8 herein is the 1st switching device. It is seen from Table 1 that the 293th node, 500th node and 707th node are respectively determined according to values of phase shift 360°/4×4, 2×(360°/4) and 3×(360°/4).

Step S93: When the interpolation factor N is changed from 4 to 8 (e.g., N2=8), seven tape-out signals at second tape-out nodes, e.g., 166th node, a 293th node, a 401th node, a 500th node, a 600th node, a 707th node and a 834th node among 1000 tape-out nodes, are outputted from each of the 4 resistor strings 81-84 by conducting the 166th, 293th, 401th, 500th, 600th, 707th and 834th switching devices 87. It is seen from Table 2 that the 166th node, 293th node, 401th node, 500th node, 600th node, 707th node and 834th node are respectively determined according to values of phase shift 360°/4×8, 2×(360°/8), 3×(360°/8), 4×(360°/8), 5×(360°/8), 6×(360°/8) and 7×(360°/8).

In the present disclosure, N2 is preferably a multiple of N1, but not limited thereto. As shown in Tables 1 and 2, when N2 is a multiple of N1, a part of the second tape-out nodes (e.g., the 293th node, 500th node and 707th node) are identical to the first tape-out nodes.

As mentioned above, to increase the accuracy of phase shift of tape-out signals, the operating method of the present disclosure further includes the steps of: changing one of the first tape-out nodes to an adjacent first tape-out node by conducting different switching device 87 (or conducting a different path of the multiplexer), when a phase of one tape-out signal outputted from the one of the first tape-out nodes has a deviation larger than or smaller than a first deviation threshold; and changing one of the second tape-out nodes to an adjacent second tape-out node by conducting different switching device 87 (or conducting a different path of the multiplexer) when a phase of one tape-out signal outputted from the one of the second tape-out nodes has a deviation larger than or smaller than a second deviation threshold.

It should be mentioned that although the above embodiments are described using examples N=4, N=5, N=8 and N=10, the present disclosure is not limited thereto. Other desired values of N are suitable to be used in the phase shifter circuit 51 by calculating the selected tape-out nodes in FIG. 8 using the equation 1–X shown in Tables 1 and 2 and 3. Any of the selected tape-out nodes in FIG. 8 can be changed by ASIC if the phase shift is deviated large enough.

As mentioned above, to increase the position accuracy detected by an optical encoder, the interpolation technique is required. However, to manufacture different resistor mixers, the mask set also needs to be changed if a different interpolation factor is required. Accordingly, the present disclosure further provides a phase shifter circuit of an optical encoder (e.g., FIG. 8) and an operating method thereof (e.g., FIG. 9) that are adapted to different interpolation factors by only changing tape-out positions at one resistor mixer without using a different resistor mixer. Furthermore, the misalignment deviation of the signal phase can be fine-tuned easily in the resistor mixer (e.g. FIG. 8) of the present disclosure.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A phase shifter circuit of an optical encoder, the phase shifter circuit being configured to receive a first signal, a second signal, a third signal and a fourth signal sequentially having a 90-degrees phase shift, the phase shifter circuit comprising:
    a first resistor string having M identical first resistors cascaded together, and two ends of the first resistor string configured to receive the first signal and the second signal, respectively;
    a second resistor string having M identical second resistors cascaded together, and two ends of the second resistor string configured to receive the second signal and the third signal, respectively;
    a third resistor string having M identical third resistors cascaded together, and two ends of the third resistor string configured to receive the third signal and the fourth signal, respectively;
    a fourth resistor string having M identical fourth resistors cascaded together, and two ends of the fourth resistor string configured to receive the fourth signal and the first signal, respectively; and
    4×(M−1) tape-out nodes respectively located between every two adjacent resistors of the M first resistors, the M second resistors, the M third resistors and the M fourth resistors,
    wherein a number of tape-out signals from each of the first, second, third and fourth resistor strings is equal to an interpolation factor N of the optical encoder subtracted by 1.

2. The phase shifter circuit as claimed in claim 1, wherein the M=1000, and the first, second, third and fourth resistors are all identical.

3. The phase shifter circuit as claimed in claim 2, wherein the N=4, and 3 tape-out signals are outputted at a 293th node, a 500th node and a 707th node of the tape-out nodes of the first, second, third and fourth resistor strings, respectively.

4. The phase shifter circuit as claimed in claim 2, wherein the N=8, and 7 tape-out signals are outputted at a 166th node, a 293th node, a 401th node, a 500th node, a 600th node, a 707th node and a 834th node of the tape-out nodes of the first, second, third and fourth resistor strings, respectively.

5. The phase shifter circuit as claimed in claim 1, wherein a selected tape-out node of one tape-out signal is changed to an adjacent tape-out node when a phase of the one tape-out signal outputted from the selected tape-out node has a deviation larger than or smaller than a deviation threshold.

6. The phase shifter circuit as claimed in claim 1, wherein the first signal and the third signal are sine wave signals, and the second signal and the fourth signal are cosine wave signals.

7. The phase shifter circuit as claimed in claim 1, further comprising 4×(M−1) switching devices configured to be coupled to the 4×(M−1) tape-out nodes to output the tape-out signals.

8. An optical encoder, comprising:
    photodiodes, configured to receive light from a code medium to output a first signal, a second signal, a third signal and a fourth signal sequentially having a 90-degrees phase shift;
    a phase shifter circuit, comprising 4 resistor strings each having M identical resistors cascaded together and respectively receiving two of the first, second, third and fourth signals having the 90-degrees phase shift, wherein a number of tape-out signals from each of the 4 resistor strings is equal to an interpolation factor N of the optical encoder subtracted by 1; and
    a comparison logic circuit coupled to the phase shifter circuit, and configured to use the first, second, third and fourth signals as well as the 4×(N−1) tape-out signals from the 4 resistor strings to generate two N-fold interpolation signals.

9. The optical encoder as claimed in claim 8, wherein each of the 4 resistor strings comprises (M−1) tape-out nodes respectively located between every two adjacent resistors of the M identical resistors for outputting the tape-out signals.

10. The optical encoder as claimed in claim 9, wherein the M=1000.

11. The optical encoder as claimed in claim 10, wherein the N=4, and 3 tape-out signals are outputted at a 293th node, a 500th node and a 707th node of the (M−1) tape-out nodes of the first, second, third and fourth resistor strings, respectively.

12. The optical encoder as claimed in claim 10, wherein the N=8, and 7 tape-out signals are outputted at a 166th node, a 293th node, a 401th node, a 500th node, a 600th node, a 707th node and a 834th node of the (M−1) tape-out nodes of the first, second, third and fourth resistor strings, respectively.

13. The optical encoder as claimed in claim 9, wherein a selected tape-out node of one tape-out signal is changed to an adjacent tape-out node when a phase of the one tape-out signal outputted from the selected tape-out node has a deviation larger than or smaller than a deviation threshold.

14. The optical encoder as claimed in claim 9, further comprising 4×(M−1) switching devices configured to be coupled to the 4×(M−1) tape-out nodes to output the tape-out signals.

15. The optical encoder as claimed in claim 8, wherein the first signal and the third signal are sine wave signals, and the second signal and the fourth signal are cosine wave signals.

16. An operating method of a phase shifter circuit of an optical encoder, the phase shifter circuit comprising 4 resistor strings each comprising M identical resistors cascaded together and (M−1) tape-out nodes respectively located between every two adjacent resistors of the M identical resistors, and each resistor string receiving two signals among four signals having a 90-degrees phase pitch, the operating method comprising:
    taping out a first number of tape-out signals at first tape-out nodes from each of the 4 resistor strings when the optical encoder is set as a first interpolation factor N1; and
    taping out a second number of tape-out signals at second tape-out nodes from each of the 4 resistor strings when the optical encoder is set as a second interpolation factor N2 different from the first interpolation factor N1,
    wherein the first tape-out nodes are determined according to values of 360°/4N1 and multiples of 360°/4N1, and the second tape-out nodes are determined according to values of 360°/4N2 and multiples of 360°/4N2.

17. The operating method as claimed in claim 16, further comprising:
    changing one of the first tape-out nodes to an adjacent first tape-out node when a phase of one tape-out signal outputted from the one of the first tape-out nodes has a deviation larger than or smaller than a first deviation threshold.

18. The operating method as claimed in claim 16, further comprising:
    changing one of the second tape-out nodes to an adjacent second tape-out node when a phase of one tape-out signal outputted from the one of the second tape-out nodes has a deviation larger than or smaller than a second deviation threshold.

19. The operating method as claimed in claim 16, wherein the N2 is a multiple of the N1.

20. The operating method as claimed in claim 19, wherein a part of the second tape-out nodes are identical to the first tape-out nodes.

* * * * *